United States Patent [19]

Pitts

[11] Patent Number: 4,566,937

[45] Date of Patent: Jan. 28, 1986

[54] ELECTRON BEAM ENHANCED SURFACE MODIFICATION FOR MAKING HIGHLY RESOLVED STRUCTURES

[75] Inventor: John R. Pitts, Golden, Colo.

[73] Assignee: The United States of America as represented by the United States Department of Energy, Washington, D.C.

[21] Appl. No.: 659,490

[22] Filed: Oct. 10, 1984

[51] Int. Cl.[4] ............................ C23F 1/02; B44C 1/22; C03C 15/00; H01L 21/306

[52] U.S. Cl. .................................. 156/628; 156/643; 156/646; 156/656; 156/659.1; 204/192 EC; 204/192 N; 219/121 EM; 250/492.3; 427/85; 427/256; 427/294; 427/399

[58] Field of Search ............... 156/628, 643, 646, 655, 156/656, 659.1; 427/85, 256, 399, 294; 204/192 R, 192 N, 192 EC, 192 E; 219/121 EE, 121 EK, 121 EZ, 121 EM; 148/1.5, 174, 187; 250/492.1, 492.2, 492.3

[56] References Cited

U.S. PATENT DOCUMENTS

| | | | |
|---|---|---|---|
| 4,212,082 | 7/1980 | Barber et al. | 365/118 |
| 4,213,192 | 7/1980 | Christensen | 365/118 |
| 4,370,195 | 1/1983 | Halon et al. | 156/643 |
| 4,377,437 | 3/1983 | Taylor et al. | 156/628 |
| 4,407,933 | 10/1983 | Fraser et al. | 430/296 |
| 4,412,885 | 11/1983 | Wang et al. | 156/643 |
| 4,490,211 | 12/1984 | Chen et al. | 156/643 |
| 4,522,674 | 6/1985 | Ninomiya et al. | 156/646 |

OTHER PUBLICATIONS

J. Vac. Sci. Technol., 20(1), Jan. 1982, Fabrication of Thick Narrow Electrodes on Concentrator Solar Cells, A. Blakers et al., pp. 13-15.
American Scientist, vol. 71, The Very Large Scale Integrated Circuit, G. W. Preston, pp. 466-472.
C&EN, Sep. 26, 1983, Electronics Industry Opens Frontiers for Photoresist Chemistry, S. C. Stinson, pp. 23-30.
IBM Technical Disclosure Bulletin, vol. 11, No. 11, Apr. 1969, Printed Circuit Production, F. A. Karner et al., p. 1449.

Primary Examiner—William A. Powell
Attorney, Agent, or Firm—Ken Richardson; James W. Weinberger; Judson R. Hightower

[57] ABSTRACT

A method for forming high resolution submicron structures on a substrate is provided by direct writing with a submicron electron beam in a partial pressure of a selected gas phase characterized by the ability to dissociate under the beam into a stable gaseous leaving group and a reactant fragment that combines with the substrate material under beam energy to form at least a surface compound. Variations of the method provide semiconductor device regions on doped silicon substrates, interconnect lines between active sites, three dimensional electronic chip structures, electron beam and optical read mass storage devices that may include color differentiated data areas, and resist areas for use with selective etching techniques.

25 Claims, 11 Drawing Figures

ELECTRON BEAM ENHANCED SURFACE MODIFICATION FOR MAKING HIGHLY RESOLVED STRUCTURES

CONTRACTUAL ORIGIN OF THE INVENTION

The U.S. Government has rights in this invention under Contract No. DE-AC02-83CH10093 between the U.S. Department of Energy and the Solar Energy Research Institute, a division of the Midwest Research Institute.

BACKGROUND OF THE INVENTION

1. Field of the Invention

The present invention relates to radiation imagery chemistry in which imaging affects a physical property of a radiation sensitive material, or produces a nonplanar or printing surface, by electron beam imaging. More specifically, the invention relates to the formation of localized oxide growth on metal films in the presence of electron beams and high vacuum level pressures of gases such as $CO_2$ or $N_2O$ that produce stable leaving groups.

2. Description of the Prior Art

Highly resolved structures are of value in a variety of technologies, such as in the manufacture of integrated circuits, mass storage devices, and micromechanical devices. For example, an integrated circuit consisting of a network of interconnected transistors on a substrate is formed using photographic and microlithographic techniques to define features as small as 2–5 micrometers. The smallness of the features accounts for the useful physical attributes of such circuits, including their speed, low power consumption, reliability, and low cost. Thus, the fineness of structure resolution marks one of the limits in integrated circuit technology, and a continued effort is being made to push back this limit by achieving higher degrees of resolution and by developing improved methods of forming highly resolved structures.

In the fabrication of semiconductor devices and integrated circuits, pattern definition is typically accomplished using optical, x-ray, electron beam, or ion beam lithography. The original pattern is transferred to a substrate by using a positive resist and an etching process, or a negative of the pattern may be formed on the substrate by use of a negative resist or lift-off of a deposited film. For dimensions below 1 micrometer, the mentioned processes have known limitations with respect to the formation of negative images of a pattern.

Very high resolution lithography capable of producing sub-50-nm line patterns is known to employ resist systems using deposited films of germanium-selenium with a $Ag_2Se$ coating in combination with electron beam exposure systems, which write a pattern on the film by causing silver to diffuse into the film and form a material resistant to alkaline etching, as described in B. Singh, S. P. Beaumont, P. G. Bower, and C. D. W. Wilkinson, Appl. Phys. Lett. 41(10), 1002 (1982). Other deposited films have also been developed that are sensitive to electron beam exposure, although not all are suitable for forming micron-sized patterns, as noted, for example, in B. Singh, S. P. Beaumont, P. G. Bower, and C. D. W. Wilkinson, Appl. Phys. Lett. 41(9), 889 (1982). Electron beam sensitive films have also been mentioned in the patent art, such as in U.S. Pat. No. 4,269,934 to Borrelli et al., which discloses silver halide based films that can be written by an electron beam to form an optical mask suitable for use in microcircuit fabrication. The use of such film is in combination with a photoresist layer on a silicon wafer or other substrate, to control the exposure of the photoresist layer to visible light.

Another technique of microcircuit fabrication, somewhat similar to ion milling, is disclosed in U.S. Pat. No. 4,243,476 to Ahn et al., wherein the etching of a substrate is combined with the use of a mask of properly selected material that will release reactive gas species when struck with an ion beam. Various metal substrates can be etched by the reactive gas species, which may be released by a selected ion beam of inert gas.

It has been proposed by J. Nulman and J. P. Krusius, Appl. Phys. Lett 42(5), 442 (1983), that a satisfactory pattern inversion technique can be achieved using positive resists, local oxidation, and reactive ion etching of aluminum to transfer a pattern having dimensions below 1 micrometer. Aluminum oxide is known to have a lower ion milling rate than either pure aluminum or silicon. Aluminum films have thus been locally oxidized by use of an oxidation mask of, for example, silicon deposited over an aluminum layer in an electron beam evaporator. An initial pattern is formed in a postive high resolution resist using optical, electron beam, ion beam, or x-ray lithography. Then, the positive resist pattern is transferred to the oxidation mask on top of the aluminum film using anisotropic etching. The resulting exposed aluminum film is locally oxidized in oxygen plasma where not protected by the mask, forming an etch-resistant aluminum oxide. The aluminum film is then patterned using anisotropic etching, resulting in an inverted pattern being formed and potentially producing a useful final structure such as a gate or interconnect line. Further processing is possible, as by using the resulting aluminum pattern as a positive etch mask for patterning the underlying material.

It has been noted by J. L. Falconer, S. D. Bischke, and G. J. Hanna, Surface Science 131, 455 (1983), that an electron beam can be used with a $CO_2$ atmosphere to enhance oxide formation on aluminum, although it is reported that the oxide is not stable unless the $CO_2$ is removed from the gas phase while the beam continues to strike the surface.

Direct beam writing on sensitive films is known for mass storage purposes. For example, a focused laser beam may be applied to InGaSb alloy films, after which the film is explosively crystallized, causing unexposed film areas to assume a rough surface while exposed film areas maintained a smooth surface that can be read by rastering under a laser beam, all as described in C. E. Wickersham, J. Vac. Sci. Technol. A 1(4), 1857 (1983).

The examples and description of the related art as given above demonstrate the importance of very high resolution lithography in many areas of technology. Developments constituting new techniques, simplifications of existing techniques, or improvements of known techniques offer important benefits to potentially all of the mentioned areas and others, as well. To achieve the foregoing and other objects and in accordance with the purpose of the present invention, as embodied and broadly described herein, the method of this invention may comprise the following.

SUMMARY OF THE INVENTION

Against the described background, it is therefore a general object of the present invention to provide a method of forming submicron structures, especially those structures that have a feature width as small as approximately 10 nm.

Another general object of the invention is to provide a simplified technique for forming high resolution structures, wherein many types of structure may be directly written onto or into a substrate that will serve as the end material of the structure.

A further general object of the invention is to provide an alternative to the traditional polymer resin photoresists that are used with lithographic techniques in the manufacture of microstructures.

It is a more specific object of the invention to enable the manufacture of interconnect lines by directly writing resist patterns on metalized films under an electron beam, and then etching away the non-written portions of the film.

Another specific object of the invention is to provide a method for the manufacture of high resolution semiconductor devices by directly writing negative resist patterns on a metalized film over a silicon wafer, selectively etching to expose the desired semiconductor areas, doping such areas, and then removing the balance of the metalized film and resist coating.

A further specific object of the invention is to enable the creation of directly written useful structures such as high density information units for mass storage by the application of electron beams in suitable gas phase atmospheres to induce attachment of submicron data indicia.

Still another specific object of the invention is to enable the creation of directly written semiconductor device regions by treatment of suitable substrate material such as silicon with an electron beam in an atmosphere of gas phase material containing a dopant as a dissociation product, such that the dopant is combined in the silicon lattice structure to form a semiconductor device under the action of the beam.

Additional objects, advantages and novel features of the invention shall be set forth in part in the description that follows, and in part will become apparent to those skilled in the art upon examination of the following or may be learned by the practice of the invention. The object and the advantages of the invention may be realized and attained by means of the instrumentalities and in combinations particularly pointed out in the appended claims.

In a method for making highly resolved submicron structures by electron beam enhanced surface modification of a substrate, a method includes the steps of, first, locating a substrate surface within an atmosphere of a partial pressure of a selected gas phase material that, when subjected to an electron beam, is capable of forming as dissociation products a reactant fragment and a stable gaseous leaving group. Next, a beam exposure pattern is written directly on the substrate surface by application of an electron beam of submicron width through the gas phase material to cause its dissociation at the impingement area of the beam and the substrate surface. Application of the beam is continued in the selected pattern for a time sufficient and in dose sufficient to form a bound surface compound structure of the reactant fragment and the substrate material, locally coating the substrate surface in the beam exposure pattern.

Thereafter, the substrate surface may be etched by a selective means for removing uncoated substrate material preferentially to the removal of the surface compound structure.

The accompanying drawings, which are incorporated in and form a part of the specification, illustrate preferred embodiments of the present invention, and together with the description, serve to explain the principles of the invention. In the drawings:

DETAILED DESCRIPTION OF THE PREFERRED EMBODIMENTS

Figure 1:
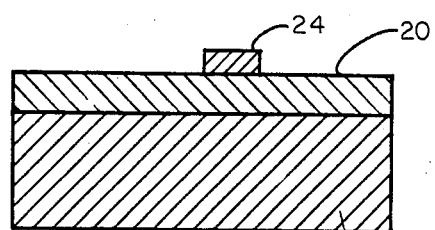
FIG. 1 is a side elevational view in cross-section of a substrate carrying a metal film coating with an interconnect line formed on its top surface, according to Example A.

Electron beam enhanced pattern formation on a metal film is adapted to provide direct write of a highly resolved structure or pattern that is made either as a device structure itself or as a mask for making structures in the substrate. The operative method includes the creation or selection of a metal surface, either bulk or thin film; the application of an electron beam to the metal surface in the presence of a gas phase material that is capable of reacting with the metal film under the electron beam to form a surface compound and a stable gaseous leaving group; directing the beam to the selected surface in a predetermined pattern for a time sufficient and in a dose sufficient to form a stable film pattern consisting of a compound of the metal and a decomposition product of the gaseous reactant; and selectively etching the metal to remove metal between pattern lines.

The substrate materials for which an electron beam will selectively enhance oxidation or cause other surface compound structures comprise generally the transition metals, although not all are reacted upon in the same manner, and other metals meeting set basic criteria. The criteria by which the substrate metals are selected are two-fold. First, with respect to metals with which an oxide is to be formed, the standard heat of formation of the oxide and the standard free energy of formation of the oxide must be large enough that the oxide is stable under all operating conditions under which the structure will be used. From a thermodynamic viewpoint, a reasonable value for the absolute value of either the standard heat of formation or the standard free energy of formation should be greater than approximately eighty kcal. per mole per metal atom, which is expressed in the following equations:

$$-\Delta H_0^0 \geqq (80 \text{ kcal./mole})/\text{metal atom}$$

and $$-\Delta F_0^0 \geqq (80 \text{ kcal./mole})/\text{metal atom}$$

where $\Delta H^0$ is the standard heat of formation, $\Delta F^0$ is the standard free energy of formation, and the subscript indicates that a normalized quantity is expressed in which the quantity is modified to indicate the energy per metal atom rather than the energy per mole of compound. Metal oxides having values below these indicated minimums likely will lack the necessary stability and be subject to spontaneous decomposition or will allow oxygen diffusion away from the beam impingement area, which would make localization of an enhanced oxide structure quite difficult to maintain.

Second, the surface and bulk mobilities of the diffusing species must be small enough that the oxide structure may be grown and stabilized at the operating temperatures. Since the temperature at which the surface mobility of an adsorbate becomes significant is approximately 0.3 times the melting point of the metal, as expressed in degrees K, the criterion for thermal stability is expressed by the equation $$T_0 < 0.3 \, T_{MP}$$

in which $T_0$ refers to the maximum operating temperature for surface structure and $T_{MP}$ refers to the temperature of the melting point. Metals meeting the above two criteria should be capable of forming a stable oxide that is restricted to the beam impact region.

The following list is the group of elemental metals that meet the stated criteria: aluminum, antimony, barium, beryllium, boron, calcium, chromium, iron, magnesium, manganese, molybdenum, silicon, strontium, tantalum, tin, titanium, tungsten, uranium, vanadium, zinc, and zirconium. In addition, alloys of these elements, such as stainless steel, may serve as suitable substrates.

Certain anomolies are expected to be found in metal and oxide behaviour despite the fact that the thermodynamic and melting point criteria are met, and in this regard a specific consideration of proposed metals is beneficial. For example, it has been reported that oxygen tends to diffuse into the crystal lattice of silicon rather than to remain localized in an oxide spot. With certain metals, oxide growth under the electron beam occurs by diffusion of oxygen to the metal interface, where oxide growth occurs. With other metals, the metal atom diffuses through the oxide layer to the surface, and new oxide growth is on the outer surface of the existing oxide. The first mechanism offers an opportunity for oxygen to diffuse into the metal crystal lattice without formation of a stable oxide, while the second mechanism tends to produce a stable oxide. Therefore, unsuitable metals for use as a substrate are expected to include any metal oxidizing by the first mechanism, in addition to other metals that meet the stated criteria but do not passivate with oxide growth, examples being sodium and iron.

The preferred background gases for use in the vacuum environment are proposed according to the requirements of the reaction model that is presently used to explain the process. Specifically, it is proposed that in the vacuum chamber the gaseous reactant is adsorbed on the surface of the substrate metal. Under the energy of the electron beam, the background gas is dissociated on or near the metal surface, forming one or more dissociation products that are chemisorbed on the metal surface. One of the dissociation products, termed the stable leaving group, may be rapidly desorbed under the action of the electron beam. Another dissociation product, termed the reactant fragment, may remain chemisorbed on the metal surface for subsequent chemical bonding under the energy of the electron beam. Continued electron bombardment of the substrate surface results in activation of the surface components at and near the beam impingement area on the surface, forming a nonstoichiometric surface compound that will continue to react until a stable, stoichiometric compound is formed. Further, since the beam penetrates the substrate surface to a considerable depth, it is expected that bulk metal under the beam will react, causing a three-dimensional growth of a nonstoichiometric compound until the system reaches equilibrium, becoming stoichiometric.

According to the proposed reaction model, dissociation of the background gas and surface bonding with the substrate are separate processes that occur with different cross-sections and, thus, different rates. Dissociation and desorption of one product may occur rapidly, leaving the second product, the reactant fragment, adsorbed on the substrate surface at an elevated concentration level. Premature termination of the electron beam may result in the second product migrating across the substrate surface by thermal processes or diffusing into the substrate. However, continued application of the beam to the substrate stabilizes the second product on the substrate at the beam target location by formation of a chemically bound layer. The depth of this layer is a function of time, current density, cross-section for activated bond formation, and diffusion kinetics of the adsorbed product.

Therefore, the criterion for selection of the background gas is that it have a stable gaseous leaving group after dissociation; and it is strongly preferred that the leaving group may be pumped by the vacuum system so that it will not interfere with the formation of a stable oxide or other surface compound that is to be formed between the substrate and second dissociation product. A leaving group that is not pumped by the vacuum system might otherwise remain adsorbed on the substrate surface and interfere with the formation of the desired surface structure. Certain leaving groups, such as $N_2$, might be harmless to the formation of a surface structure oxide. In certain cases, such as with the use of $O_2$ gas, no leaving group is formed, as it would be expected that the dissociated molecule would form two equivalent products, both of which can equally enter the surface structure. This situation is equivalent to the formation of a stable leaving group, which in this case is a null group.

The gases that are considered suitable at least for the formation of oxide surface structures on metals are as follow: carbon dioxide ($CO_2$), nitrous oxide ($N_2O$), nitrogen dioxide ($NO_2$), water vapor ($H_2O$), and oxygen ($O_2$). The respective leaving groups are CO, $N_2$, NO, $H_2$, and the null group.

The impingment of an electron beam on the surface of the selected material is conducted in accordance with known techniques, such as the use of a vacuum chamber using a proper vacuum to permit the beam to reach the substrate surface. In the same vacuum chamber the substrate may be deposited as a thin film on an underlying body of one or more other materials, thereby forming a substrate stack. The electron beam may be supplied by a scanning electron microscope (SEM) or by commercially available electron beam lithography equipment. While several examples of beam configuration are given below, it should be noted that they are given by way of example and have not been developed necessarily to demonstrate an optimum beam configuration. Formation of a stable pattern on the substrate surface is readily detectable by the use of Auger electron spectroscopy, using the electron beam as the excitation source. Auger peaks for the reactive species, the substrate material, and the combined surface structure material can be observed, with the detection of the last mentioned signal providing positive indication of sufficient beam exposure to form a stable surface structure of the reactant and substrate material.

Etching techniques for removing parts of a substrate layer are similarly known. Chemical etching, for example with an acid, is used with certain materials. Ion milling and reactive ion etching are also suitable. Useful etching techniques must provide a selective action that removes one substrate surface in preference to another so that a pattern formed in or on the substrate will be preserved in the post-etching product. Properties such as hardness, thickness, chemical acid resistance, photodegradation, and ion degradation, all merely as examples, may be called upon in the determination of which type of etching is appropriate in a specific instance.

In oxidation experiments carried out on 180 nm aluminum thin films evaporated onto quartz substrates, the operation of the method has been confirmed in the presence of carbon dioxide gas as follows.

Example 1: Oxide was grown under a 2 keV primary electron beam, 1.3 micrometers FWHM, 2nA beam current (150 mA/cm$^2$) and approximately 47 kL exposure. A gas jet was used which allowed a local pressure at the sample of about two orders of magnitude greater than the system. Growth of localized aluminum oxide structure under the beam was confirmed by Auger electron spectroscopy signals for aluminum oxide, aluminum metal, and oxygen.

Example 2: Another experiment was conducted with a beam energy of 10 keV, beam size 0.11 micrometers FWHM, and exposure of 12600 L. The beam size was then decreased and oxygen intensity monitored as a function of distance. The resulting aluminum oxide structure had a FWHM of 0.68 micrometers, or about six times that of the beam FWHM.

In experiments to determine the depth of oxide formation on aluminum, depths of 4.8 nm and 22 nm were indicated, which show that the oxide coating formed under an electron beam is thicker than the passivation layer that is normally formed on aluminum in air or oxygen.

Experiments similar to the ones using carbon dioxide were performed using nitrous oxide. An aluminum substrate exposed to a 5 keV electron beam, 1 micrometer FWHM, 10 nA and 489 kL $N_2O$, for example, showed oxide growth similar to that observed with a partial pressure of $CO_2$.

Among the useful patterns that can be obtained by the described process as applied to aluminum or other metals or semiconductors are contacts, conductive paths, new device structures using highly resolved oxide regions, and increased density mass storage devices. The degree of spatial resolution that is possible with this technique is limited primarily by the diameter of the electron beam. It is common practice for high resoltion SEM manufacturers to achieve electron beam diameters of less than 10 nm. Therefore, it is reasonably anticipated that oxide structures with characteristic dimensions of 50 nm or less could be built using the present method. Further details of the manufacture of submicron structures are given in the following paragraphs.

A. Microcircuit construction presently employs photolithography to lay down conductor design connecting the active regions of the substrate. The inherent limit of resolution using such techniques is the wavelength of light used—about 0.5 micrometers. As described below in specific reference to aluminum, a metal substrate film may be laid down covering an entire underlying substrate surface. Thin oxide pathways may then be constructed using a rastered, programmed electron beam in a $CO_2$ or $N_2O$ gas phase background, creating the proper connections between all the active device regions, the resolution of the pathways being limited only by the diameter of the electron beam. After the pathways are stabilized by proper beam dosage, the substrate is chemically etched, for example with HCl or with reactive ion etching, to remove the surface metal film selectively, leaving behind a conductive conduit under the thin oxide film. Repetition of the oxidation, metallization, and etching steps permits production of a three dimensional wiring network in the microcircuit.

Figure 2:
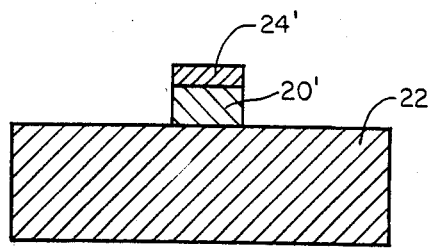
FIG. 2 is a view similar to FIG. 1, but showing the structure resulting from removal of unprotected metal film to expose the substrate, according to Example A.

In a specific example applied to aluminum metal, which is a widely used pattern material in the microelectronics manufacturing art, a useful pattern such as an interconnect line is formed on an aluminum thin film surface, as illustrated in FIGS. 1-4. With reference to FIG. 1, a thin film of aluminum (20), for example 100 to 200 nm thick, is formed on the surface of a suitable substrate or substrate stack (22) by evaporation, such as on a substrate of silicon, in a vacuum background of less than $1 \times 10^{-6}$ Torr. The resulting film is substantially free of native oxide while in the background vacuum. The gas phase material, such as $CO_2$, is admitted until a pressure of $2 \times 10^{-6}$ to $4 \times 10^{-6}$ Torr is obtained. An electron beam of from 0.5 to 10 keV is applied to the aluminum thin film using a raster and gate technique to define and refresh a preselected interconnectline pattern (24). Exposure continues for a period during which the Auger $AlO_x$ signal builds, such period being commonly from one minute to twenty minutes. With reference to FIG. 2, following formation of a stable pattern and while maintaining vacuum, the aluminum film is subjected to reactive ion etching to expose the substrate (22) except where prohibited by the more resistant oxide (24). The aluminum pattern (20') remaining on the substrate (22) is a positive of the desired pattern and is useful as an interconnect line of the selected pattern geometry. A residual, thin oxide layer (24') may or may not remain on the aluminum pattern (20') after completion of the etching process.

Figure 3:
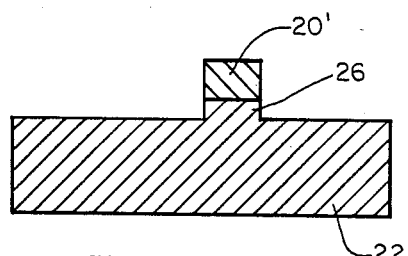
FIG. 3 is a view similar to FIG. 1, but showing the structure resulting from etching the structure of FIG. 2, according to Example A.
Figure 4:
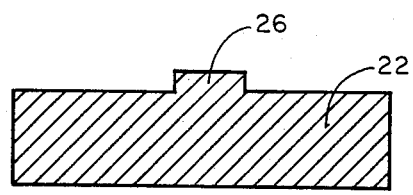
FIG. 4 is a view similar to FIG. 1, but showing the structure resulting from further etching of the structure of FIG. 3, according to Example A.
Figure 5:
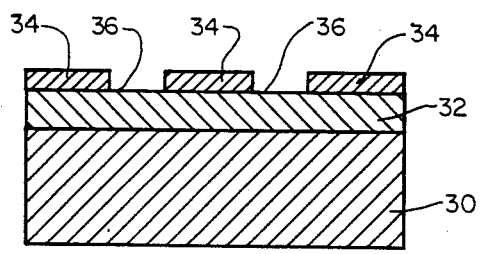
FIG. 5 is a side elevational view in cross-section, showing the preliminary structure for formation of a semiconductor device according to Example B.

As shown in FIG. 3, further processing with the pattern (20') is possible according to known techniques, such as using the pattern (20′) as a mask to form a desired pattern (26) in the substrate stack (22), maintaining the aluminum interconnect (20′). Optionally, the aluminum (20′) could be removed by a further etching process, leaving only the desired pattern (26) in the substrate stack, as shown in FIG. 4.

Figure 6:
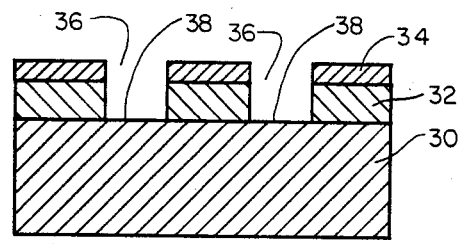
FIG. 6 is a view similar to FIG. 5, but showing the structure resulting from etching the surface of FIG. 5, according to Example B.
Figure 7:
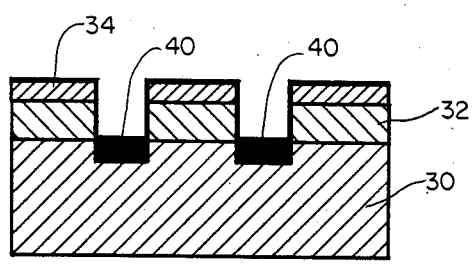
FIG. 7 is a view similar to FIG. 5, but showing the structure resulting from doping the surface of FIG. 6, according to Example B.
Figure 8:
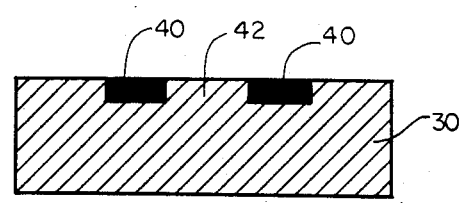
FIG. 8 is a view similar to FIG. 5, but showing the structure resulting from etching the surface of FIG. 7, according to Example B.

B. Semiconductor junctions or other active sites may be formed as illustrated in FIGS. 5–8 by utilizing the characteristic of the oxide to function as a resist. In this process, the substrate (30) is selected to be, for example, a silicon wafer. Second, the wafer is coated with a thin film (32) of aluminum metal. Third, a rastered electron beam is applied to the full surface of the substrate to deposit an enhanced film of oxide (34), excluding those areas (36) where devices are to be formed. Thus, because of the fine resolution made possible with an electron beam, the device areas (36) will remain covered with clean aluminum. As shown in FIG. 6, a reactive ion etch of the coated substrate will remove the clean aluminum (32) at the device areas (36) and expose underlying substrate areas (38). As sown in FIG. 7, the exposed substrate areas (38) may be doped by conventional processes such as thermal diffusion or ion implantation, producing doped regions (40) in the surface of the silicon wafer at areas (38). Next, as shown in FIG. 8, the full oxide layer (34) and aluminum layer (32) are etched away, leaving behind a clean substrate surface (42) having highly defined active regions (40) where the doping took place. The active regions (40) may be interconnected by using the technique for forming interconnect lines as described above.

Figure 9:
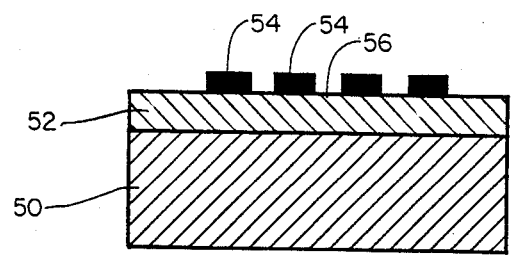
FIG. 9 is a side elevational view in cross-section of a mass storage device, constructed according to Example C.

C. Fabrication of a mass storage device is made possible by the ability to write fine spot structures onto a metal surface in the presence of a suitable gas phase. In FIG. 9 a platen of aluminum or a disc of other substrate (50) is coated with a thin continuous film (52) of aluminum to serve as the storage medium. Digital information may be recorded on the disc by the use of oxide spots (54) and clean aluminum areas (56) as the two digital states. The platen may receive the information according to known indexing techniques, using a plurality of predetermined locations as data areas of which selected ones will remain clean, while others are subjected to electron beam enhanced spot growth. The oxide spots are grown with the electron beam techniques described previously, and, since the beam is easily rastered and positioned, the recording medium may remain stationary.

The state of each defined spot may be read with the electron beam by any of a variety of techniques that will be referred to generally as "electron beam analysis techniques." These include the detection of any beam product or by-product that is capable of providing data directly or indirectly indicative of a detected surface compound on a platen, such electron beam analysis techniques including by way of example and not limitation, backscattered electrons, transmitted electrons, absorbed current, secondary electrons, Auger electrons, and x-ray emissions. The spot packing density, based upon the creation of spots a few tens of nanometers in diameter, may be on the order of $10^{12}$ bits/cm$^2$, which is an increase by two orders of magnitude as compared to the standards of present mass storage, in which data spots are a few hundred nanometers in diameter.

Alternately, the state of the surface may be probed by other means. The index of refraction of the oxide is substantially different from the metal, permitting the detection of oxide spots by an optical scanner. It is noted that present technology does not permit a beam of light to be focused on a structure as fine as 10 nm, creating an inherent limit on the resolution available with optical techniques. One additional method step of use with a mass storage device is to prepare the metal platen prior to oxidation such that oxidized spots will appear as different colors and different shades of color, permitting optical scanning techniques to be used with multiple light beams of different colors to detect reflectance or absorption at various frequencies over a defined region of spots, thereby taking advantage of the increased density of a beam-written platen. Various metal ions are well known to provide coloration to oxides, as observed, for example, in the various coloration of alumina (colorless, blue, yellow, purple, green, pink, and red). The metals of choice may be incorporated into the substrate at the chosen locations by a combination of masking and diffusion, or in some cases by ion implantation. Standard techniques such as ion etching may be used to erase information stored on a platen as the described spots. After erasure, the platen or any partial portion thereof is refreshed and ready for reuse.

Figure 10:
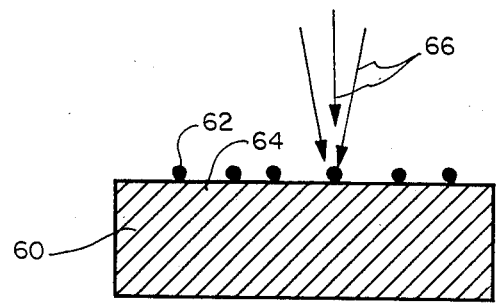
FIG. 10 is side elevational view in cross-section, showing a method of doping semiconductor materials according to Example D.

D. With a variation of the disclosed method, semiconductor materials may be doped by means of electron beam induced decomposition to produce active device regions. The size of present electronic devices is limited by the photolithographic techniques employed and by the smearing of boundary regions by ion implantation and thermal diffusion techniques used to insert impurity atoms into the host lattice. As illustrated by FIG. 10, these problems may be overcome by, first, preparing a substrate (60) of semiconductor material such as n-type or p-type silicon, and then exposing the substrate to a dopant in gas phase in a vacuum environment, adsorbing some molecules (62) on the substrate surface (64). The gas phase dopant may be a compound or a complex that carries the desired doping atom in combination with components that can decompose into one or more stable leaving groups at the surface of the substrate. At least during the period of device fabrication, the substrate may be cooled, for example by liquid nitrogen to −190 degrees C., to reduce to a negligible rate the thermal diffusion processes that normally form the p-n junctions in the substrate. The gas phase dopant is then exposed to the electron beam (66), which is focused on a fine point of the substrate, and, in addition, the beam is chosen to yield a high dissociation cross-section for the desired species so that the desired dopant atom is deposited onto the substrate surface, and the remainder of the molecule desorbs into the vacuum and does not interfere with the further reaction.

Figure 11:
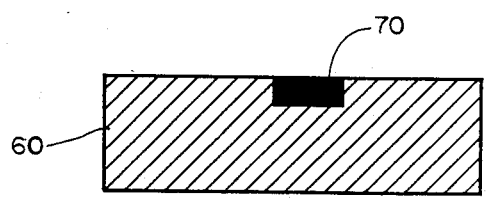
FIG. 11 is a view similar to FIG. 10, showing the semiconductor device formed by the method of Example D.

Under further exposure to the electron beam, as illustrated in FIG. 11, the adsorbed dopant atom is incorporated into the substrate lattice and may diffuse into the bulk of the lattice in the electron beam interaction volume, forming a p-n junction (70) of specific surface dimension and depth. The method may be practiced with multiple beams of differing energy focused into essentially the same spot, making possible the application of a first beam with its energy chosen for a large dissociation cross-section of the carrier molecule, and application of a second beam with its energy selected for yielding a large activation cross-section of the substrate. The substrate lattice is modified to contain the finely structured p-n junctions at multiple locations, which may be connected by the above described techniques for applying interconnect lines.

In the example of paragraph D, the initial substrate (60) may be undoped silicon, in which case active device regions are formed by initially doping the desired regions with a first dopant according to the disclosed method, and further doping the same regions or adjacent regions with a dopant of different type as described above to complete the semiconductor device regions (70).

E. In an expansion of the technique mentioned above for the formation of doped semiconductor materials, a two dimensional array of active circuit elements on a substrate may be expanded in the third dimension. An auto or hetero epitaxial film may be grown over the original substrate, and, by repetition of the circuit design process, an additional layer of circuit elements is created on the same substrate. Additional epitaxial growth and circuit creation will expand the three dimensional array, with conducting leads being brought to the side of the block for hook-up.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be regarded as falling within the scope of the invention as defined by the claims that follow.

The embodiments of the invention in which an exclusive property or privilege is claimed are defined as follows:

1. A method of defining high resolution submicron structures on a substrate surface, comprising:
   (a) locating a substrate surface within a vacuum chamber together with a partial pressure of a selected gas phase material that is capable of forming as dissociation products under an electron beam a stable gaseous leaving group and a reactant fragment capable of chemically bonding with the material of the substrate surface to form a stable compound under the conditions of the vacuum chamber; and
   (b) applying a first electron beam of a first beam energy and of submicron beam width through the gas phase to a defined submicron-dimensioned location on said substrate surface for a time sufficient and in a dose sufficient to form at said defined location a surface compound consisting of the reactant fragment and the substrate material.

2. The method of claim 1, wherein said substrate surface comprises a metal capable of forming a compound of a first predetermined color under the energy of an electron beam with said reactant fragment, doped with a metal species at designated locations capable of imparting a second predetermined color to the compound of the substrate material and the reactant fragment, further comprising scanning the substrate surface with a plurality of at least two light beams of different colors; and detecting the reflectances of the light beams at said defined location on the substrate surface for the frequencies of the light beams employed.

3. The method of claim 1, wherein said substrate surface comprises semiconductor material and said gas phase consists essentially of a gas having a dopant as a reactant fragment, said dopant being capable of combining with the semiconductor material to form an active device region.

4. The method of claim 3, further comprising, at least during the application of the electron beam to the substrate, cooling the mean temperature of the substrate surface to reduce thermal diffusion of the dopant into the substrate material outside the defined area of beam impingement.

5. The method of claim 3, wherein said first electron beam is of a beam energy adapted to cause dissociation of said gas phase material, and further comprising: simultaneously with application of said first beam, applying a second electron beam of a second beam energy to said defined location, the second beam energy being adapted to cause diffusion of the dopant into the substrate material at said defined location.

6. The method of claim 1, further comprising: after applying the electron beam, etching the substrate surface by a selective means for removing unreacted substrate material preferentially to the removal of reacted substrate material.

7. The method of claim 1, wherein said substrate surface comprises a metallic element capable of forming a compound having a standard heat of formation and a standard free energy of formation with absolute value greater than 80 (kcal./mole) metal atom; and the gas phase reactant comprises a molecule containing oxygen as a reactant fragment.

8. The method of claim 7, wherein said gas phase is chosen from the group consisting of:
   carbon dioxide
   nitrous oxide
   nitrogen dioxide
   water vapor and
   oxygen.

9. The method of claim 7, wherein said substrate material is chosen from the group consisting of: aluminum, antimony, barium, beryllium, boron, calcium, chromium, iron, magnesium, manganese, molybdenum, silicon, strontium, tantalum, tin, titanium, tungsten, uranium, vanadium, zinc, and zirconium.

10. The method of claim 9, wherein said substrate material comprises an alloy of an element listed in claim 9.

11. The method of claim 1, wherein the submicron structures are defined at selected ones of a plurality of predetermined locations on a substrate surface defining a mass storage device, and further comprising: scanning said plurality of predetermined locations with an electron beam under vacuum; and detecting the presence of said structures at the selected locations by an electron beam analysis technique.

12. A method of forming submicron structures by electron beam enhanced surface modification of a substrate, including the steps of:
   (a) locating a substrate surface within an atmosphere of a partial pressure of a selected gas phase material that is capable of forming as dissociation products a reactant fragment and a stable leaving group when subjected to an electron beam;
   (b) writing a beam exposure pattern directly on said substrate surface by applying to the surface an electron beam of submicron width through the gas phase to cause dissociation of the gas phase and accumulation of the reactant fragment at the interface of the beam and the substrate surface;
   (c) continuing application of the electron beam to said pattern for a time sufficient and in dose sufficient to form a bound surface compound structure of the reactant fragment and substrate material locally coating the substrate surface in the beam exposure pattern; and (d) etching the substrate surface by a selective means for removing uncoated substrate material preferentially to the removal of said surface compound structure.

13. The method of claim 12, wherein said substrate surface is comprised of a first material and is carried on a substrate stack having an underlying body of second material that is capable of being doped to form a semiconductor device, further comprising:

(a) exposing a portion of the second material by continuing said selective etching step sufficiently to remove an uncoated portion of the first material;

(b) doping said exposed portion of the second material to form a semiconductor device region; and (c) exposing a further portion of the second material by application of an etching means for removing the substrate coating and first material preferentially to removal of the second material from the substrate stack.

14. The method of claim 13, further comprising, after etching to remove the substrate coating and first material:

(a) metalizing the exposed surface of said second material;

(b) defining an interconnect line location from the semiconductor device region by writing a beam exposure pattern directly on said metalized surface under a partial pressure of a selected gas phase material capable of dissociating under electron beam exposure to oxygen and a stable gaseous leaving group;

(c) continuing beam exposure for a time sufficient and a dose sufficient to form a bound oxide surface compound structure of the metal and oxygen; and (d) defining the interconnect line from the semiconductor device region by etching the metalized surface by a selective means for removing the unoxidized metal coating preferentially to the removal of the oxidized metal and the underlying semiconductor device region in the substrate stack.

15. The method of claim 13, wherein said second material consists essentially of doped silicon.

16. The method of claim 14, wherein said metalized surface consists essentially of aluminum.

17. The method of claim 12, wherein said gas phase is chosen from the group consisting of:
carbon dioxide
nitrous oxide
nitrogen dioxide
water vapor and
oxygen.

18. The method of claim 12, wherein said substrate material is chosen from the group consisting of: aluminum, antimony, barium, beryllium, boron, calcium, chromium, iron, magnesium, manganese, molybdenum, silicon, strontium, tantalum, tin, titanium, tungsten, uranium, vanadium, zinc, and zirconium.

19. The method of claim 18, wherein said substrate material comprises an alloy of an element of the group of claim 18.

20. A method of forming a submicron semiconductor device in a silicon substrate, comprising:

(a) locating a silicon substrate in a partial pressure of a gas phase material that dissociates under the energy of an electron beam to yield a dopant dissociation product capable of becoming incorporated into the crystal lattice of the substrate under the energy of an electron beam;

(b) applying a first electron beam of a first beam energy and of submicron beam width to a selected location on the substrate surface; and (c) continuing application of said first beam to the selected location for a time sufficient and in a dose sufficient to induce accumulation of the dopant dissociation product at said selected location and to induce incorporation of the dopant dissociation product into the crystal lattice of the substrate to define a submicron semiconductor device region.

21. The method of claim 19, wherein said gas phase material is of the type capable of thermally diffusing its dopant into the silicon substrate, further comprising cooling the substrate at least during electron beam exposure to reduce thermal diffusion of the gas phase dopant outside the beam exposure area.

22. The method of claim 20, further comprising simultaneously with application of said first beam, applying a second electron beam of submicron width and of a second beam energy to substantially the same selected location, wherein the first beam energy is adapted to cause dissociation of the gas phase material into at least the dopant, and the second beam energy is adapted to cause diffusion of the dopant into the silicon crystal lattice.

23. The method of claim 20, further comprising after defining said semiconductor device region:

(a) vacuum depositing a metal film over the substrate surface, wherein the metal is capable of forming a stable oxide surface structure;

(b) locating said metalized substrate surface in a partial pressure of a gas phase material comprising a gas capable of dissociating under the energy of an electron beam into a stable gaseous leaving group and oxygen;

(c) applying an electron beam of submicron width to the metalized surface in a pattern defining an interconnect line from said semiconductor device area;

(d) continuing application of the electron beam in said pattern for a time sufficient and in a dose sufficient to cause accumulation of oxygen at the interface of the beam and the metalized surface and to induce formation of a stable oxide surface compound structure in the beam pattern; and (e) defining a residual intrconnect line of said metal film from the semiconductor device region by etching the metalized surface with a selective means for removing uncoated portions of the metal in preference to the coated portions of the metal.

24. The method of claim 23, further comprising, after definition of the semiconductor device region and interconnect line on the substrate surface, vacuum depositing an epitaxial film over the substrate surface.

25. The method of claim 24, further comprising depositing a silicon layer on said epitaxial film.

* * * * *